(12) United States Patent
Pereira

(10) Patent No.: US 10,380,809 B2
(45) Date of Patent: Aug. 13, 2019

(54) SYSTEM AND METHOD OF FAULT DETECTION

(71) Applicant: GE Aviation Systems, LLC, Grand Rapids, MI (US)

(72) Inventor: Frazer Leslie Pereira, Cheltenham (GB)

(73) Assignee: GE AVIATION SYSTEMS LLC, Grand Rapids, MI (US)

( * ) Notice: Subject to any disclaimer, the term of this patent is extended or adjusted under 35 U.S.C. 154(b) by 0 days.

(21) Appl. No.: 15/119,392

(22) PCT Filed: Feb. 11, 2015

(86) PCT No.: PCT/US2015/015326
§ 371 (c)(1),
(2) Date: Aug. 17, 2016

(87) PCT Pub. No.: WO2015/126686
PCT Pub. Date: Aug. 27, 2015

(65) Prior Publication Data
US 2017/0053463 A1 Feb. 23, 2017

(30) Foreign Application Priority Data
Feb. 21, 2014 (IN) .............................. 863/CHE/2014

(51) Int. Cl.
*G06F 17/00* (2006.01)
*G01R 31/00* (2006.01)
(Continued)

(52) U.S. Cl.
CPC .............. *G07C 5/0808* (2013.01); *B64F 5/60* (2017.01); *G01R 31/008* (2013.01); *G05B 23/0264* (2013.01); *G05B 23/0283* (2013.01)

(58) Field of Classification Search
None
See application file for complete search history.

(56) References Cited

U.S. PATENT DOCUMENTS 5,600,576 A 2/1997 Broadwater
6,714,021 B2 3/2004 Williams
(Continued)

FOREIGN PATENT DOCUMENTS

CN 101847868 A 9/2010
CN 103134690 A 6/2013
(Continued)

OTHER PUBLICATIONS

International Search Report and Written Opinion issued in connection with corresponding PCT application PCT/US2015/015326 dated May 7, 2015.
(Continued)

*Primary Examiner* — Thomas G Black
*Assistant Examiner* — Demetra R Smith-Stewart
(74) *Attorney, Agent, or Firm* — McGarry Bair PC

(57) ABSTRACT

A fault monitoring system for an aircraft includes a processor having a fault diagnosis algorithm, a memory connected to the processor, a plurality of sensors located at selected nodes in an electrical network of the aircraft and connected to the processor, and a data collection algorithm in one of the processor or the plurality of sensors. Each sensor is configured to continuously monitor voltage and current of the electrical network at its selected node and to transmit data representative of the monitored voltage and current to the processor. Upon the occurrence of a fault event, the data collection algorithm selects a subset of the data related to the fault event and at least one sensor transmits a selected subset of the data to one of the processor or the memory.

12 Claims, 2 Drawing Sheets

(51) Int. Cl.
  *G01R 31/11* (2006.01)
  *B64F 5/00* (2017.01)
  *G07C 5/08* (2006.01)
  *G05B 23/02* (2006.01)
  *B64F 5/60* (2017.01)

(56) References Cited

U.S. PATENT DOCUMENTS

| | | | |
|---|---|---|---|
| 6,917,888 B2* | 7/2005 | Logvinov | H04B 3/54 |
| | | | 324/512 |
| 7,509,537 B1 | 3/2009 | Jensen | |
| 7,868,621 B2* | 1/2011 | Liu | G01R 31/008 |
| | | | 324/512 |
| 7,940,055 B2 | 5/2011 | Harres et al. | |
| 9,009,530 B1* | 4/2015 | Chen | G06F 11/3676 |
| | | | 714/26 |
| 9,104,650 B2* | 8/2015 | Hosek | G06F 11/2257 |
| 2006/0215335 A1* | 9/2006 | Deshpande | H02H 1/0015 |
| | | | 361/42 |
| 2007/0279068 A1 | 12/2007 | Harres | |
| 2008/0027592 A1 | 1/2008 | Fernandez-Ramos | |
| 2011/0270484 A1 | 11/2011 | Grube | |
| 2014/0257624 A1* | 9/2014 | Safa-Bakhsh | G06F 17/00 |
| | | | 701/31.4 |
| 2015/0096359 A1* | 4/2015 | Catt | G07C 5/008 |
| | | | 73/112.01 |
| 2016/0052642 A1* | 2/2016 | Gordon | B64D 45/00 |
| | | | 701/3 |

FOREIGN PATENT DOCUMENTS

| | | |
|---|---|---|
| CN | 103415975 A | 11/2013 |
| EP | 1873603 A2 | 1/2008 |
| EP | 1967929 A2 | 9/2008 |

OTHER PUBLICATIONS

Gang, Y., and Dongchao, Y., "Research of the Failure Predication for the Aircraft Power Supply System," Aviation Maintenance & Engineering, vol. 6, pp. 38-41 (2008).

First office Action and Search issued in connection with corresponding CN Application No. 201580009646.9 dated Mar. 15, 2018.

* cited by examiner

SYSTEM AND METHOD OF FAULT DETECTION

BACKGROUND

Contemporary aircraft include electrical power distributions systems for use within the aircraft to provide electrical power to essential and non-essential electrical loads. Within the electrical power distribution system, faults may occur when electrically conducting elements open circuit or short circuit as a result of loose electrical connections or aging electrical components. Alternatively, a fault may occur when power transfers to an electrical load from an electrical source in an unexpected way such as during an arcing event. Typically, faults in electrical power distribution are mitigated by circuit breakers and ground fault interrupters that decouple the load from the power source upon detection of a fault.

BRIEF DESCRIPTION OF THE INVENTION

One aspect of the invention relates to a fault monitoring system for an aircraft. The system comprises: a processor having a fault diagnosis algorithm, a memory connected to the processor, a plurality of sensors located at selected nodes in an electrical network of the aircraft and connected to the processor, and a data collection algorithm in one of the processor or the plurality of sensors. Each sensor is configured to continuously monitor voltage and current of the electrical network at its selected node and to transmit data representative of the monitored voltage and current to the processor. Upon the occurrence of a fault event, the data collection algorithm selects a subset of the data related to the fault event and at least one sensor transmits a selected subset of the data to one of the processor or the memory.

Another aspect of the invention relates to a method of monitoring an electrical network in an aircraft for faults. The method comprises continuously monitoring voltage and current of the electrical network at selected. The method further comprises evaluating the data to identify a fault event, and if a fault event is identified, selecting a subset of the data related to the fault event, and transmitting the selected subset of the data to the memory for storage.

DETAILED DESCRIPTION OF THE INVENTION

Figure 1:
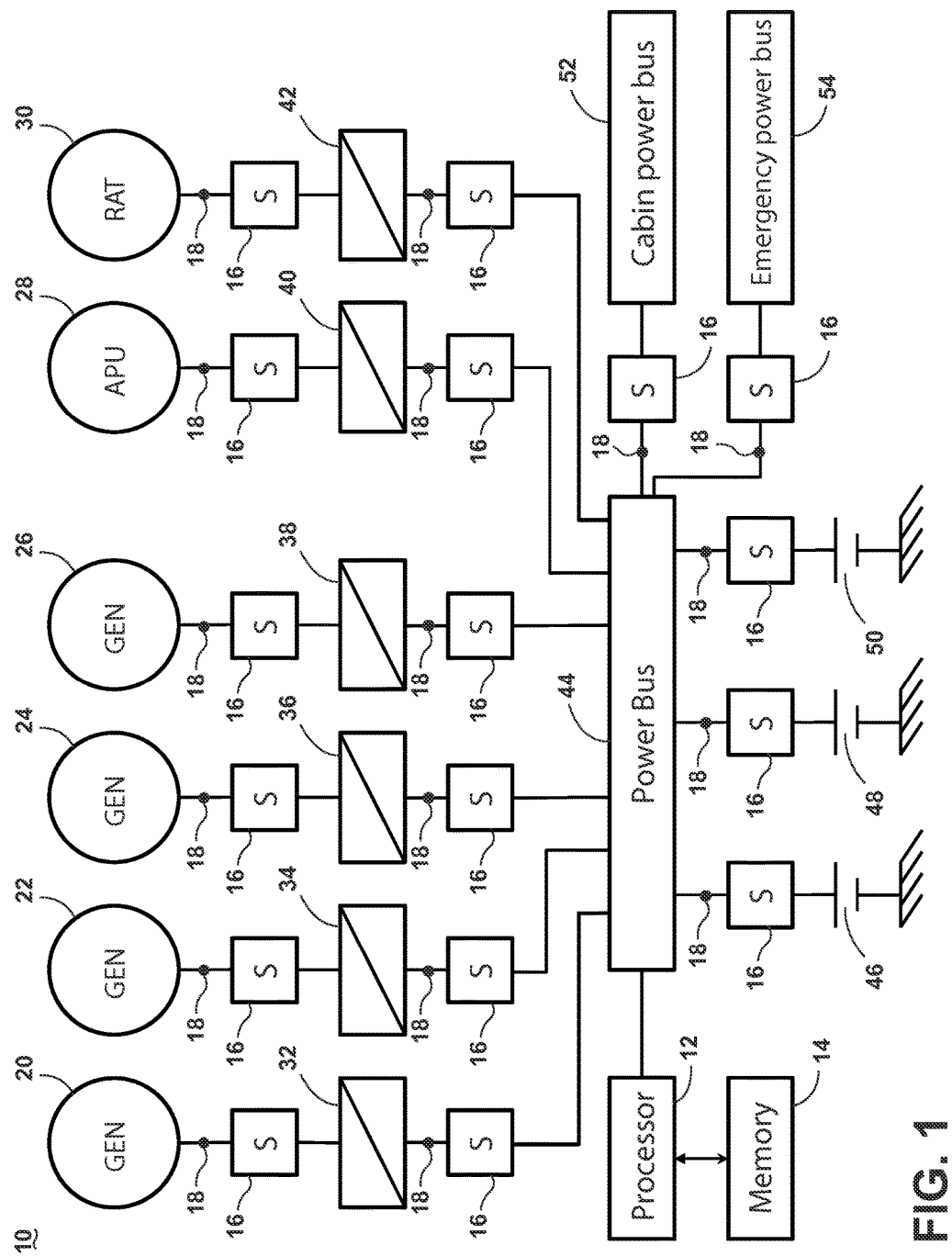
FIG. 1 is block diagram showing the fault monitoring system integrated with the electrical network of an aircraft according to an embodiment of the invention.

In the background and the following description, for the purposes of explanation, numerous specific details are set forth in order to provide a thorough understanding of the technology described herein. It will be evident to one skilled in the art, however, that the exemplary embodiments may be practiced without these specific details. In other instances, structures and devices are shown in diagram form in order to facilitate description of the exemplary embodiments.

The exemplary embodiments are described with reference to the drawings. These drawings illustrate certain details of specific embodiments that implement a module, method, or computer program product described herein. However, the drawings should not be construed as imposing any limitations that may be present in the drawings. The method and computer program product may be provided on any machine-readable media for accomplishing their operations. The embodiments may be implemented using an existing computer processor, or by a special purpose computer processor incorporated for this or another purpose, or by a hardwired system.

As noted above, embodiments described herein may include a computer program product comprising machine-readable media for carrying or having machine-executable instructions or data structures stored thereon. Such machine-readable media can be any available media, which can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium that can be used to carry or store desired program code in the form of machine-executable instructions or data structures and that can be accessed by a general purpose or special purpose computer or other machine with a processor. When information is transferred or provided over a network or another communication connection (either hardwired, wireless, or a combination of hardwired or wireless) to a machine, the machine properly views the connection as a machine-readable medium. Thus, any such a connection is properly termed a machine-readable medium. Combinations of the above are also included within the scope of machine-readable media. Machine-executable instructions comprise, for example, instructions and data, which cause a general purpose computer, special purpose computer, or special purpose processing machines to perform a certain function or group of functions.

Embodiments will be described in the general context of method steps that may be implemented in one embodiment by a program product including machine-executable instructions, such as program codes, for example, in the form of program modules executed by machines in networked environments. Generally, program modules include routines, programs, objects, components, data structures, etc. that have the technical effect of performing particular tasks or implement particular abstract data types. Machine-executable instructions, associated data structures, and program modules represent examples of program codes for executing steps of the method disclosed herein. The particular sequence of such executable instructions or associated data structures represent examples of corresponding acts for implementing the functions described in such steps.

Embodiments may be practiced in a networked environment using logical connections to one or more remote computers having processors. Logical connections may include a local area network (LAN) and a wide area network (WAN) that are presented here by way of example and not limitation. Such networking environments are commonplace in office-wide or enterprise-wide computer networks, intranets and the internet and may use a wide variety of different communication protocols. Those skilled in the art will appreciate that such network computing environments will typically encompass many types of computer system configurations, including personal computers, hand-held devices, multiprocessor systems, microprocessor-based or programmable consumer electronics, network PCs, mini-computers, mainframe computers, and the like.

Embodiments may also be practiced in distributed computing environments where tasks are performed by local and remote processing devices that are linked (either by hard-wired links, wireless links, or by a combination of hardwired or wireless links) through a communication network. In a distributed computing environment, program modules may be located in both local and remote memory storage devices.

An exemplary system for implementing the overall or portions of the exemplary embodiments might include a general purpose computing device in the form of a computer, including a processing unit, a system memory, and a system bus, that couples various system components including the system memory to the processing unit. The system memory may include read only memory (ROM) and random access memory (RAM). The computer may also include a magnetic hard disk drive for reading from and writing to a magnetic hard disk, a magnetic disk drive for reading from or writing to a removable magnetic disk, and an optical disk drive for reading from or writing to a removable optical disk such as a CD-ROM or other optical media. The drives and their associated machine-readable media provide nonvolatile storage of machine-executable instructions, data structures, program modules and other data for the computer.

Technical effects of the method disclosed in the embodiments include the early detection and diagnosis of faults in electrical networks. Because the disclosed fault monitoring system may be implemented, in part, with low cost, readily available electronic components, existing aircraft electrical networks may be readily retrofit. Other technical effects include improved operation and maintenance of aircraft electrical networks based on analysis of the data acquired from the fault monitoring system.

Referring now to FIG. 1, a block diagram showing the fault monitoring system 10 integrated with the electrical network of an aircraft according to an embodiment of the invention is shown. An electrical power distribution system for an aircraft comprises an electrical network of power sources and electrical loads interconnected at nodes 18 of the network by components to transform and direct the power from the power sources to the electrical loads. The fault monitoring system 10 comprises a processor 12, a memory 14 and a plurality of sensors 16 located at selected nodes 18 of the electrical network.

The power sources of an electrical power distribution system may include one or more generators 20, 22, 24, 26 that are driven independently by the engines of the aircraft. Each of the generators 20, 22, 24, 26 may produce electrical power at a high voltage. The current output from the generators 20, 22, 24, 26 may be alternating or direct current depending upon the configuration of the generators. In addition to the generators 20, 22, 24, 26 driven by the main propulsion engines, other power sources may include an auxiliary power unit or APU 28 and a ram air turbine or RAT 30. Contemporary aircraft may include an APU 28 which is typically implemented as one or more turbine engines. Typically, APUs use gas turbine engines that burn jet fuel to turn a turbine to drives an electric generator. A RAT is a small turbine that is connected to a hydraulic pump that generates power from the airstream by ram pressure due to the speed of the aircraft.

The output of the generators 20, 22, 24, 26 may be electrically coupled to an electrical converter 32, 34, 36, 38 to convert the high voltage power output to an appropriate voltage level for operating the electrical systems in the cabin or for emergency power systems on the aircraft. Typical electrical systems in the cabin or for emergency power systems on an aircraft operate at 115 VAC at 400 Hz, 270 VDC or 28 VDC. Consequently, the electrical converter 32, 34, 36, 38 may also need to convert an alternating current to a direct current or vice versa depending upon the configuration of the generators 20, 22, 24, 26 and the type of aircraft electrical systems to be powered by the electrical power distribution system. In other words, the electrical converter 32, 34, 36, 38 may transform the input voltage and current from the generators 20, 22, 24, 26 to be compatible with the voltage and current requirements of the electrical loads powered by the electrical power distribution system. Similarly, the APU 28 and the RAT 30 may be electrically coupled to electrical converters 40 and 42 respectively.

Electrical power distribution systems for aircraft may include a plurality of different power sources. For example, the electrical power distribution system may also include thermal electrical generators 46. To generate power on an aircraft, thermal electrical generators 46 include as array of thermocouples mounted on the exhaust section of the engines and convert exhaust heat into electricity.

Additional power sources may include one or more batteries 48. The batteries 48 provide a direct current power source and may be used during startup of other power sources or may be used as a redundant power source. The batteries 48 may be recharged by electrical power generated by other power sources on the electrical network. Fuel cells 50 provide a direct current power source by chemically converting fuel (such as hydrogen) into electrical energy.

The power bus 44 switches and distributes the power from each of the power sources to the electrical loads. The power bus 44 may direct power to the cabin power bus 52 to provide power to the aircraft cabin electrical systems and the emergency power bus 54 to provide power to the aircraft emergency electrical systems. As shown in FIG. 1, the power bus 44 may be electrically coupled to the processor 12.

Typically, faults in the aircraft electrical network occur over milliseconds and are either mitigated or repaired later in time. The root cause of the fault is typically not explored since a technician does not have access to the data related to the events before the fault. To monitor the above-described electrical network for variations or anomalies in the voltage and current flow, the fault monitoring system 10 is integrated into the electrical network of the electrical power distribution system. Each node 18 of the electrical network electrically interconnects elements of the network and is characterized by the voltage and current level at the node 18.

Consequently, the fault monitoring system 10 includes a voltage and current sensor 16 at selected nodes 18. Each sensor 16 is configured to continuously monitor voltage and current of the electrical network at its selected node 18. The continuously monitored current and voltage characteristics are sampled (that is digitized at a predetermined data rate preferably greater than 1 kHz). Each sensor 16 may include a local memory for saving the data. The sensor 16 includes a limited local memory that acts as a buffer organized as a first in, first out (FIFO) data stack. The memory for each sensor may be limited to storing as few as three data values for storing voltage or current characteristics like amplitude and frequency as well as a predetermined threshold.

The sensor 16 may additionally include a processing element to identify the occurrence or calculate a probability of the occurrence of a fault condition. For example, the sensor 16 may identify a fault condition by comparing the values of the buffered data to a predetermined threshold. If the values exceed the threshold, then the processing element local to the sensor 16 may determine a fault has occurred or likely to have occurred. As well, the sensor 16 may have a data collection algorithm associated with the processing element that can select or preserve data related to the fault event. Similarly, the sensor 16 may detect a fault condition and selectively sample the data according to the data collection algorithm.

Upon detection of a fault condition or a likely fault condition, the sensor 16 may be configured to transmit data representative of the monitored voltage and current to the processor 12. The transmitted data may be a subset of all collected data, related to the fault event. In the case of an onboard processor 12, the sensor 16 may transmit the subset of data over the electrical network by taking advantage of the network of powerlines or conductors directing power from the power sources to the power bus 44. Powerline communications systems operate by adding a modulated carrier signal (i.e. encoded data) to a power-carrying electrical system. Additional communications to establish a ground-link with the processor 12 may be implemented for a remotely located processor 12. Typical radio frequency communications to send information between aircraft and ground stations include a VHF digital link (VDL). The selective transmission may be initiated by the sensor 16, the processor 12, airport personnel including the pilot or maintenance staff, other processors located on the aircraft, etc. The processor 12 may be located onboard the aircraft or at a remote ground station.

The processor 12 may include a fault diagnosis algorithm and a data collection algorithm. The processor's fault diagnosis algorithm evaluates the data to identify a fault event. If a fault event is identified, the processor's data collection algorithm selects a subset of the data related to the fault event and transmits the selected subset of the data to the memory 14 for storage. When a fault is detected, a selected subset of the data that includes data collected over a predetermined time period measured from the fault event is stored in the memory 14 where the predetermined time period may precede the fault event or commence with the fault event. In this way, the subset data may capture the variations in the voltage and current characteristics at each node 18 in the electrical network to establish the source of the fault.

Figure 2:
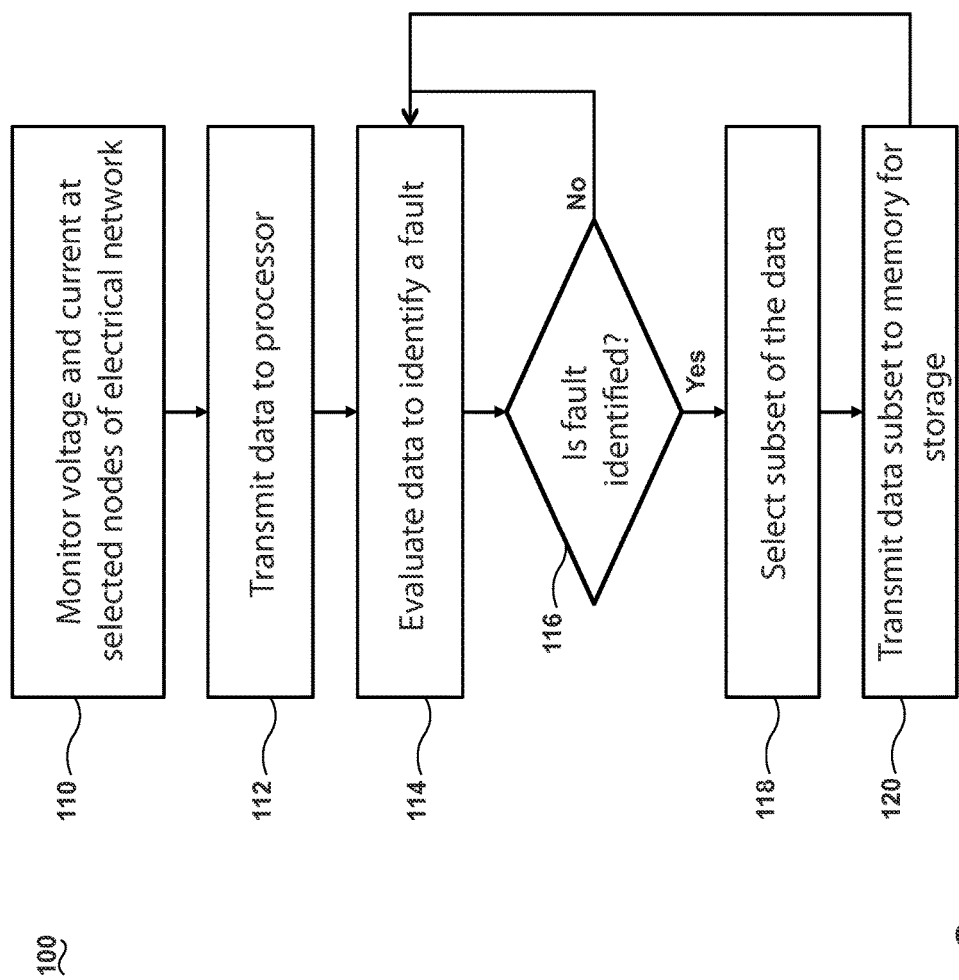
FIG. 2 is a flowchart showing a method of monitoring the electrical network of an aircraft according to another embodiment of the invention.

Referring now to FIG. 2, a flowchart showing a method 100 of monitoring the electrical network of an aircraft according to another embodiment of the invention is shown. At step 110, the sensors 16 continuously monitor the voltage and current of the electrical network at selected nodes 18. The sensors 16 may include a data collection algorithm to sample and buffer a subset of the monitored voltage and current data. The sensors 16 may transmit data representative of the monitored voltage and current to the processor 12 at step 112. At step 114, the sensors 16, the processor 12 or both may evaluate the data to identify a fault event. In this way, the chronological order of steps 112 and 114 may be interchanged depending upon the implementation of the system. Additionally, the sensors 16 may initiate the transmittal of data at step 112 in response to a local evaluation of the data to identify a fault at 114 in the same system where the processor 12 may initiate a transmittal of data from the sensors at step 112 prior to evaluation of the data at step 114. In this way, the fault monitoring system is multi-modal; that is, the sensors 16 may identify local faults and the processor 12 may identify global faults.

The evaluation process may include analysis based on case-based reasoning, data filtering and thresholding, artificial intelligence algorithms or statistical modeling including influence networks and hybrid Markov mixture models. If the processor 12 identifies a fault event at step 116, then the processor 12 at step 118 may select a subset of the data and then at step 120 transmit the data subset to memory for storage. If the processor 12 does not identify a fault at step 116 or transmits a data subset to memory at step 120, then the processor 12 returns to step 114 to evaluate the transmitted data to identify a fault.

By using the data gathering system and method disclosed in the embodiments, the collection of fault related data may be used to determine that cause of faults in an electrical network, particularly an electrical power distribution system of an aircraft. Additionally, the processor 12 may further include a fault prognosis algorithm configured to evaluate the selected subset of the data from the memory 14 and, based on the evaluation, predict a fault in the electrical network of the aircraft. In this way, the above-described system and method enables the aircraft to act as a real-time test bed. Aircraft engineers may perform design improvements in response to the data analysis performed on the data collected by the above-described system integrated with electrical power distribution systems onboard currently deployed aircraft.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A fault monitoring system for an aircraft comprising:
   a plurality of sensors located at selected nodes in an electrical network of the aircraft,
   a processor having a fault diagnosis algorithm, the processor remote from the plurality of sensors and commonly accessible to the plurality of sensors through a communications network,
   a memory connected to the processor, and
   a data collection algorithm in one of the processor or the plurality of sensors,
   wherein each sensor is configured to continuously monitor voltage and current of the electrical network at its selected node, and
   wherein upon the occurrence of a fault event, the data collection algorithm selects a subset of the data related to the fault event including at least a portion of the continuously monitored voltage and current immediately preceding the fault event and at least one sensor transmits the selected subset of the data to one of the processor or the memory.

2. The fault monitoring system of claim 1 wherein the selected subset of the data includes data collected over a predetermined time period measured from the fault event.

3. The fault monitoring system of claim 2 wherein the predetermined time period precedes the fault event.

4. The fault monitoring system of claim 2 wherein the predetermined time period commences with the fault event.

5. The fault monitoring system of claim 1 wherein the selected subset of the data is transmitted from at least one of the plurality of sensors using power line communication.

6. The fault monitoring system of claim 1 wherein the fault diagnosis algorithm evaluates the fault event.

7. The fault monitoring system of claim 1 further comprising a fault prognosis algorithm configured to evaluate the selected subset of the data from the memory and, based on the evaluation, predicts a fault in the electrical network of the aircraft.

8. A method of monitoring an electrical network for faults in an aircraft comprising:
   continuously monitoring and collecting data representative of voltage and current of the electrical network at selected nodes,
   evaluating the data to identify a fault event, and if a fault event is identified,
   selecting a subset of the data related to the fault event including at least a portion of the data immediately preceding the fault event, and
   transmitting the selected subset of the data to one of a processor or memory for later analysis,
   wherein the one of the processor or memory is remote from the selected nodes and commonly accessible to the selected nodes.

9. The method of claim 8 wherein the selecting step is based on a predetermined time period related to the fault event.

10. The method of claim 9 wherein the predetermined time period precedes the fault event.

11. The method of claim 9 wherein the predetermined time period commences with the fault event.

12. The method of claim 8 further comprising evaluating the selected subset of the data and, based on the evaluation, predicting a fault in the electrical network of the aircraft.

\* \* \* \* \*